(12) United States Patent
Hwang et al.

(10) Patent No.: US 11,011,455 B2
(45) Date of Patent: May 18, 2021

(54) ELECTRONIC PACKAGE STRUCTURE WITH IMPROVED BOARD LEVEL RELIABILITY

(71) Applicant: Amkor Technology, Inc., Tempe, AZ (US)

(72) Inventors: Tae Kyung Hwang, Seoul (KR); Eun Sook Sohn, Seoul (KR); Won Joon Kang, Seoul (KR); Gi Jeong Kim, Gyeonggi-do (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 0 days.

(21) Appl. No.: 15/893,591

(22) Filed: Feb. 10, 2018

(65) Prior Publication Data

US 2018/0166365 A1    Jun. 14, 2018

Related U.S. Application Data

(63) Continuation of application No. 14/984,554, filed on Dec. 30, 2015, now Pat. No. 9,929,075.

(30) Foreign Application Priority Data

Mar. 3, 2015    (KR) .......................... 10-2015-0029706

(51) Int. Cl.
*H01L 23/495* (2006.01)
*H01L 23/498* (2006.01)
*H01L 23/31* (2006.01)

(52) U.S. Cl.
CPC .... *H01L 23/49503* (2013.01); *H01L 23/3107* (2013.01); *H01L 23/49541* (2013.01);
(Continued)

(58) Field of Classification Search
CPC .......... H01L 23/49503; H01L 23/3107; H01L 23/49548; H01L 23/49861; H01L 23/49541
See application file for complete search history.

(56) References Cited

U.S. PATENT DOCUMENTS 6,025,640 A    2/2000  Yagi et al.
6,774,499 B1 *  8/2004  Yang ..................... H01L 21/568
                                              257/736
(Continued)

FOREIGN PATENT DOCUMENTS

KR    10-2012-0031681 A    4/2012
KR    10-2015-0009668 A    1/2015
TW       201306142 A1    2/2013

OTHER PUBLICATIONS

Notice of Allowance received from Korean Patent Office in Korean; English Translation Not Available; dated Jul. 15, 2016; 2 pages.
(Continued)

*Primary Examiner* — Allen L Parker
*Assistant Examiner* — Gustavo G Ramallo
(74) *Attorney, Agent, or Firm* — Kevin B. Jackson (57) ABSTRACT

A method for providing an electronic package structure includes providing a substrate having a die pad having a die pad top surface and an opposing die pad bottom surface, leads laterally spaced apart from the die pad, and a substrate encapsulant interposed between the die and the leads and includes a substrate top surface and an opposing substrate bottom surface. The substrate encapsulant is provided such that the die pad and the leads protrude outward from the substrate bottom surface. The method includes providing an electronic device having opposing major surfaces and a pair of opposing outer edges. The method includes connecting the electronic device to the substrate such that one major surface of the electronic device is spaced apart from the die
(Continued)

pad top surface and upper surfaces of the leads, and the outer edges overlap an opposing pair of the leads.

18 Claims, 4 Drawing Sheets

(52) U.S. Cl.
CPC .. *H01L 23/49548* (2013.01); *H01L 23/49861* (2013.01); *H01L 23/49816* (2013.01); *H01L 2224/16245* (2013.01); *H01L 2924/181* (2013.01)

(56) References Cited

U.S. PATENT DOCUMENTS

| | | | | |
|---|---|---|---|---|
| 8,067,821 | B1* | 11/2011 | Choi | H01L 23/49551 |
| | | | | 257/666 |
| 9,472,427 | B2* | 10/2016 | Bathan | H01L 21/568 |
| 2003/0001252 | A1* | 1/2003 | Ku | H01L 23/3107 |
| | | | | 257/686 |
| 2003/0006055 | A1* | 1/2003 | Chien-Hung | H01L 23/3107 |
| | | | | 174/534 |
| 2003/0024723 | A1 | 2/2003 | Igarashi | |
| 2003/0102543 | A1* | 6/2003 | Anzai | H01L 23/49548 |
| | | | | 257/678 |
| 2005/0077601 | A1 | 4/2005 | Yu | |
| 2006/0017142 | A1* | 1/2006 | Jang | H01L 23/3107 |
| | | | | 257/672 |
| 2007/0170570 | A1* | 7/2007 | Camacho | H01L 23/3107 |
| | | | | 257/686 |
| 2009/0127682 | A1* | 5/2009 | Kim | H01L 23/49861 |
| | | | | 257/676 |
| 2011/0278710 | A1* | 11/2011 | Cho | H01L 23/49575 |
| | | | | 257/676 |
| 2015/0021751 | A1 | 1/2015 | Paek et al. | |
| 2015/0243587 | A1 | 8/2015 | Yang | |

OTHER PUBLICATIONS

Office Action received from Korean Patent Office in Korean; English Translation Not Available; dated Feb. 1, 2016; 7 pages.
Office Action received from Taiwan Patent Office in Chinese with English Translation; dated Jun. 23, 2017; 11 pages.
Search Report from Taiwan Patent Office with a Taiwan Patent Office dated Jul. 25, 2019; 1 page.

* cited by examiner

ELECTRONIC PACKAGE STRUCTURE WITH IMPROVED BOARD LEVEL RELIABILITY

CROSS-REFERENCE TO RELATED APPLICATIONS

This application is a continuation of U.S. patent application Ser. No. 14/984,554 filed on Dec. 30, 2015 and issued as U.S. Pat. No. 9,929,075 on Mar. 27, 2018, which claims priority from Korean Patent Application No. 10-2015-0029706 filed on Mar. 3, 2015 in the Korean Intellectual Property Office, and all the benefits accruing therefrom under 35 U.S.C. § 119, the contents of which in its entirety are herein incorporated by reference.

BACKGROUND

The present invention relates, in general, to electronics, and more particularly, to semiconductor packages, structures thereof, and methods of forming semiconductor packages.

Electronic devices, such as semiconductor dies are conventionally enclosed in package structures that protect the semiconductor die from hostile environments and that enable electrical interconnection between the semiconductor die and a next level of assembly, such as a printed circuit board ("PCB") or motherboard. The elements of a typical package structure include a conductive leadframe or substrate, an integrated circuit or semiconductor die, conductive structures, such as bond wires or solder balls that electrically connect pads on the semiconductor die to individual leads of the leadframe or substrate, and a hard plastic encapsulant material that covers the other components and forms an exterior of the semiconductor package commonly referred to as the package body. Portions of the individual leads are configured to electrically connect the package structure to the next level assembly.

In the past, certain reliability issues have plagued packaged electronic devices particularly in chip-scale packaged electronic devices having a high density of interconnects in a small footprint package. Such reliability issues have included, for example, poor bonding between the package electronic device and solder materials used to connect the packaged electronic device to a next level assembly and as well as other stress induced failures.

Accordingly, it is desirable to have a structure and method for forming packaged electronic devices that reduce the occurrence of reliability issues, such as those described previously. It is further desirable for the structure and method to be cost effective and manufacturable.

For simplicity and clarity of illustration, elements in the figures are not necessarily drawn to scale, and the same reference numbers in different figures denote generally the same elements. As used herein, the term "and/or" includes any and all combinations of one or more of the associated listed items. In addition, the terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprises," "comprising," "includes," and/or "including," when used in this specification, specify the presence of stated features, numbers, steps, operations, elements, and/or components, but do not preclude the presence or addition of one or more other features, numbers, steps, operations, elements, components, and/or groups thereof. It will be understood that, although the terms first, second, etc. may be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure. Additionally, descriptions and details of well-known steps and elements are omitted for simplicity of the description. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word about, approximately or substantially means a value of an element is expected to be close to a state value or position. However, as is well known in the art there are always minor variances preventing values or positions from being exactly stated. Unless specified otherwise, as used herein the word over or on includes orientations, placements, or relations where the specified elements can be in direct or indirect physical contact. Unless specified otherwise, as used herein the word overlapping includes orientations, placements, or relations where the specified elements can at least partly coincide or align in the same or different planes. It is further understood that the embodiments illustrated and described hereinafter suitably may have embodiments and/or may be practiced in the absence of any element that is not specifically disclosed herein.

DETAILED DESCRIPTION OF THE DRAWINGS

The present description includes, among other features, an electronic package structure comprising a substrate. The substrate includes a lead frame configured with one or more structural features configured to improve board level reliability of the electronic package. In one embodiment, the lead frame includes protrusions that extend outward from a surface of the electronic package. The protrusions are configured to laterally engage conductive connective structures, such as solder balls. In another embodiment, conductive bumps are attached to exposed portions of the lead frame in advance of attaching the electronic package structure to a next level of assembly. In a further embodiment, the lead frame is configured with different points of contact for attaching an electronic die to the lead frame and for attaching the lead frame to the next level of assembly. More particularly, the points of contact are laterally separated from each other to, among other things, reduce the vertical concentration of stress regions in the electronic package structure.

In one embodiment, the electronic package structure comprises a substrate. The substrate comprises a die pad having a die pad top surface and an opposing die pad bottom surface, wherein the die pad comprises a conductive material. A plurality of leads are laterally spaced apart from the die pad, and a substrate encapsulant is interposed between the die pad and the plurality of leads, wherein the substrate encapsulant has a substrate top surface and an opposing substrate bottom surface, and wherein the die pad and plurality of leads protrude outward from the substrate bottom surface. An electronic die is electrically coupled to the die pad and the plurality of leads and a package body encapsulates the electronic die and the substrate top surface, wherein the substrate bottom surface is exposed to the outside.

In another embodiment, the electronic package comprises a substrate. The substrate comprises a die pad having a die pad top surface and an opposing die pad bottom surface, wherein the die pad comprises a conductive material. A plurality of leads are laterally spaced apart from the die pad each lead having a lead top surface and an opposing lead bottom surface. A substrate encapsulant is interposed between the die pad and the plurality of leads, wherein the substrate encapsulant has a substrate top surface and an opposing substrate bottom surface. Conductive bumps are disposed on the die pad bottom surface and the lead bottom surfaces. An electronic die is electrically coupled to the die pad and the plurality of leads and a package body encapsulating the electronic die and the substrate top surface, wherein the substrate bottom surface is exposed to the outside. In one embodiment, the die pad bottom surface and lead bottom surfaces can be substantially co-planar with the substrate bottom surface In a still further embodiment, the electronic package structure comprises a substrate including a die pad and a plurality of leads spaced apart from the die pad. An electronic die is electrically connected to the die pad and the plurality of leads. an encapsulant structure encapsulating the substrate and the electronic die, wherein a bottom surface of the die pad and bottom surfaces of the plurality of leads are exposed to the outside, wherein the electronic die is attached to first portions of the plurality of leads to define first connection points, and wherein the plurality of leads comprise second portions attached to the first portions, wherein the second portions are configured to define second connection points for attaching to a next level of assembly, and wherein the first connection points and the second connection points are laterally separated.

In a still further embodiment, an electronic package structure comprises a substrate, which comprises a die pad having die pad top surface and an opposing die pad bottom surface, wherein the die pad comprises a conductive material, a plurality of leads laterally spaced apart from the die pad each lead having a lead top surface and an opposing lead bottom surface, and a substrate encapsulant interposed between the die pad and the plurality of leads, wherein the substrate encapsulant has a substrate top surface and an opposing substrate bottom surface. An electronic die electrically coupled to the die pad and the plurality of leads, and a package body encapsulating the electronic die and the substrate top surface, wherein the substrate bottom surface is exposed to the outside. The substrate further comprises one or more structural features configured to improve board-level reliability, the one or more features comprising one or more of: the die pad and the plurality of leads configured to protrude outward from the substrate bottom surface such that side surfaces of the die pad and side surfaces of the plurality of leads are exposed to the outside, conductive bumps disposed on the die pad bottom surface and the lead bottom surfaces, and/or at least one lead comprising a first lead portion exposed to the outside of the substrate bottom surface and defining a first connection point for attaching the electronic package structure to a next level of assembly, and a second lead portion laterally extending towards the die pad and having a recessed bottom surface encapsulated by the substrate encapsulant, the second lead portion defining a second connection point for attaching to the electronic die, wherein the first connection point is laterally separated from the second connection point.

Various aspects of the present description can be embodied in different forms and should not be construed as being limited to the example embodiments set forth herein. Rather, these example embodiments of the disclosure are provided to convey various aspects of the disclosure to those of ordinary skill in the art.

Figure 1A:
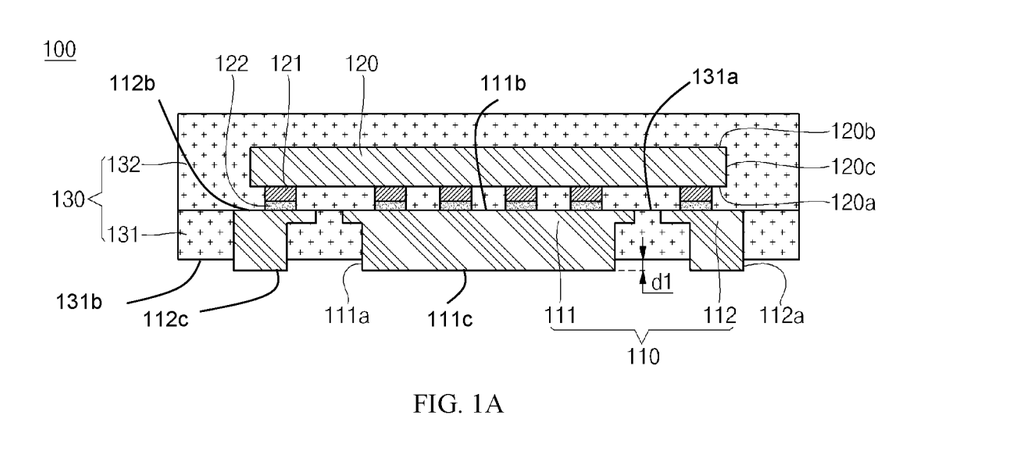
FIG. 1A illustrates a cross-sectional view of an electronic package in accordance with an embodiment of the present invention.
Figure 1B:
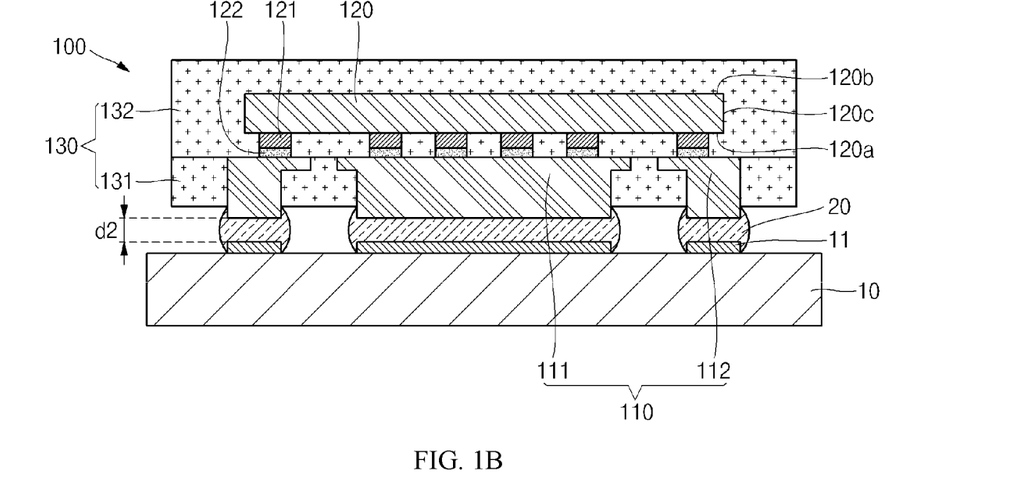
FIG. 1B illustrates a cross-sectional view of the electronic package of FIG. 1A attached to a next level of assembly in accordance with an embodiment of the present invention.

FIG. 1A illustrates a cross-sectional view of an electronic package 100 or electronic package structure 100, such as a semiconductor package 100, in accordance with a first embodiment. FIG. 1B illustrates a cross-sectional view of semiconductor package 100 attached to a next level of assembly, such as a circuit board or printed circuit board ("PCB"). In accordance with the present embodiment, semiconductor package 100 comprises a substrate 110, such as a lead frame 110 and a substrate encapsulant 131, an electronic die 120, such as a semiconductor die 120, and package body 132. In one embodiment, substrate encapsulant 131 and package body 132 are configured as an encapsulant structure 130. In one embodiment, semiconductor die 120 can be an integrated circuit device, such as an analog device, a logic device, a mixed-signal device, a power device, a discrete device, a sensor device, an optical device, and/or a similar device as known to those of skill in the art.

In one embodiment, lead frame 110 includes a die pad 111 having a die pad top surface 111b and an opposing die pad bottom surface 111c. In one embodiment, die pad bottom surface 111c comprises a continuous and substantially planar surface. Stated another way, die pad bottom surface 111c is formed without, is absent, or is free of intentionally formed recessed portions or intentionally formed etched portions. In one embodiment, die pad 111 comprises a conductive material such as copper, a copper alloy, a plated material, combinations thereof, or other materials as known to those of skill in the art. In one embodiment, die pad 111 comprises a substantially rectangular plate shape having four sides and four corners, which may be rounded. It is understood that other shapes may be used as well. In some embodiments, the outer periphery of die pad 111 can be reduced in thickness using, for example, etching or stamping techniques.

In one embodiment, lead frame 110 further comprises a plurality of leads 112 spaced apart from die pad 111. Each lead 112 includes a lead top surface 112b and an opposing lead bottom surface 112c. In one embodiment, substrate encapsulant 131 encapsulates, covers, or encloses, for example, side portions of lead frame 110 except for portions that protrude outward from semiconductor package 100 as described hereinafter. Substrate encapsulant 131 includes a substrate top surface 131a and an opposing substrate bottom surface 131b. Semiconductor die 120 is electrically connected to die pad 111 and plurality of leads 112.

In accordance with the present embodiment, semiconductor package 100 is configured to have a die pad protrusion 111a, which protrudes or extends outside or away from substrate bottom surface 131b or the bottom surface of encapsulant 130. Die pad protrusion 111a is configured to better facilitate the attachment of semiconductor package 100 to circuit board 10. More particularly, die pad protrusion 111a provides both vertical surfaces and a horizontal surface for engaging an attachment structure, such as a solder ball 20 as illustrated, for example, in FIG. 1B. In some embodiments, die pad protrusion 111a can have a thickness d1 of up to about 10 microns particularly if the height of semiconductor package is 100 is constrained. In other embodiments where package height or thickness is not constrained, thickness d1 can be less than about 25 microns. In accordance with the present embodiment, when semiconductor package 100 is attached to printed circuit board 10, die pad protrusion 111a is configured to facilitate solder ball 20 surrounding the lateral surfaces or vertical surfaces of die pad protrusion 111a in addition to its horizontal surface, which allows for semiconductor package 100 to be more stably and reliably connected to circuit board 10 or other assembly structures.

In one embodiment, plurality of leads 112 are spaced apart from the peripheral edge segments (e.g., four sides) of die pad 111 and can be arranged in directions perpendicular to the peripheral edge segments. Each lead 112 is further spaced apart from other leads 112 so that the leads are electrically disconnected from each other in some embodiments. It is understood that in some embodiments, some of the leads 112 can be electrically connected to each other depending on the system application. In accordance with the present embodiment, each of leads 112 includes a lead protrusion 112a that protrudes or extends outside or away from substrate bottom surface 131b or the bottom surface of encapsulant 130. In one embodiment, at least some of the lead protrusions 112a are formed to have a similar shape as die pad protrusion 111a. Lead protrusions 112a protrude to a lower portion of each of the plurality of leads 112 and to the outside of semiconductor package 100 as generally illustrated in FIG. 1A. In accordance with the present embodiment, lead protrusions 112a are configured to better facilitate the attachment of semiconductor package 100 to circuit board 10. More particularly, lead protrusions 112a provide both vertical surfaces and horizontal surfaces for engaging attachment structures, such as solder balls 20 as illustrated, for example, in FIG. 1B. In some embodiments, lead protrusions 112a can have a thickness d1 of less than about 10 microns particularly if the height of semiconductor package is 100 is constrained. In other embodiments where package height is not constrained, thickness d1 can be greater than about 10 microns. In accordance with the present embodiment, when semiconductor package 100 is attached to circuit board 10, lead protrusions 112a are configured to facilitate solder ball 20 surrounding the vertical surfaces or lateral surfaces of lead protrusions 112a in addition to their horizontal surfaces, which allows for semiconductor package 110 to be more stably and reliably connected to printed circuit board 10 or other assembly structures.

In some embodiments, semiconductor die 120 has a plate like shape and has a first surface 120a and a second surface 120b opposite to first surface 120a. Semiconductor die 120 includes a plurality of conductive pads 121 formed on first surface 120a. In some embodiments, semiconductor die 120 may include a protection layer (not shown) formed to cover the first surface 120a of the semiconductor die 120 but leaving plurality of conductive pads 121 exposed to the outside. Plurality of conductive pads 121 can comprise aluminum, an aluminum alloy, copper, or other materials as known to those of skill in the art.

In accordance with the present embodiment, semiconductor die 120 is mounted on the lead frame 110 such that first surface 120a and the plurality of conductive pads 121 face the top surface of lead frame 110 or substrate top surface 131a. By way of example, conductive pads 121 can be attached or connected to lead frame 110 using a plurality of conductive bumps 122. In some embodiments, the width of semiconductor die 120 may be larger than the width of die pad 111 such that at least a portion of first surface 120a overlaps at least portions of leads 112. In one embodiment, more than one conductive bump 122 connects semiconductor die 120 to die pad 111 as illustrated, for example, in FIGS. 1A and 1B.

Encapsulant 130 encapsulates lead frame 110 and semiconductor die 120 in order to protect exposed portions of lead frame 110 and semiconductor die 120 from external environments. In accordance with the present embodiment, encapsulant 130 includes a first encapsulant 131 or substrate encapsulant 131 encapsulating the lead frame 110 and a second encapsulant 132 or package body 132 encapsulating semiconductor die 120. Encapsulant 130 may be configured such that the first encapsulant 131 and the second encapsulant 132 are integrally formed.

Substrate encapsulant 131 encapsulates lateral surfaces of the lead frame 110 and is formed or provided to expose top and bottom surfaces of the lead frame 110 to the outside. In addition, substrate encapsulant 131 is formed or provided to expose die pad protrusion 111a and lead protrusions 112a of lead frame 110. In accordance with the present embodiment, die pad protrusion 111a and lead protrusions 112a are formed to protrude outward such that lead bottom surfaces 112c and die pad bottom surface 111c lie on a different plane than substrate bottom surface 131b. Package body 132 encapsulates semiconductor die 120 adjacent to substrate top surface 112b. In some embodiments, the side surfaces of substrate encapsulant 131 and the side surfaces of package body 132 are substantially coplanar.

With reference to FIG. 1B, semiconductor package 100 can be mounted or attached to a next level of assembly 10, such as circuit board 10. In one embodiment, circuit board 10 comprises a circuit pattern 11 electrically connected to lead frame 110 of semiconductor package 100 using conductive connective structures 20, such as solder balls 20. In one embodiment, solder balls 20 are connected between circuit pattern 11 and die pad protrusion 111a of lead frame 110 and between circuit pattern 11 and lead protrusions 112a. In accordance with the present embodiment, solder balls 20 are connected to circuit pattern 11 so as to surround the lateral surfaces or vertical surfaces of die pad protrusion 111a and lead protrusions 112a. These attributes facilitate semiconductor package 100 being more stably connected to circuit board 10, thereby improving reliability of the assembly structure. In one embodiment, a first solder structure electrically connects die pad bottom surface 111c to a first portion circuit pattern 11 and a second solder structure electrically connects a lead 112 to a second portion of circuit pattern 11, wherein the first solder structure has a greater width than the second solder structure as illustrated, for example, in FIG. 1B. In one embodiment, the first solder structure extends entirely across die pad bottom surface 111c as generally illustrated, for example, in FIG. 1B. In a further embodiment, the first solder structure surrounds lateral surfaces of the die pad protruding from the substrate bottom surface, and the second solder structure surrounds lateral surfaces of one of the plurality of leads protruding from the substrate bottom surface.

In some embodiments, solder balls 20 connecting semiconductor package 100 to circuit board 10 have a thickness d2 of about 150 microns or less. In some embodiments, solder balls 20 can be made of conductive materials, such a tin/lead, leadless tin, and other similar materials as known to those of skill in the art.

In summary, semiconductor package 100 according to the present embodiment comprises die pad protrusion 111a and lead protrusions 112a protruding to the outside of semiconductor package 100. These protrusions better facilitate using conductive structures, such as solder balls 20 to electrically connect semiconductor package 100 to a next level of assembly, such as circuit board 10. In accordance with the present embodiment, the conductive structures surrounds the lateral surfaces of die pad protrusion 111a and lead protrusions 112a to provide a more stable physical and electrical connection between semiconductor package 100 and circuit board 10 thereby improving the reliability of the assembled structure (i.e., board-level reliability).

Figure 2A:
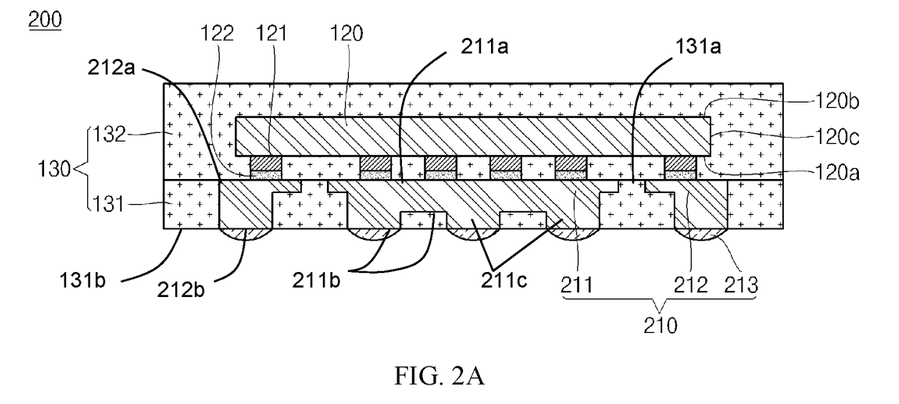
FIG. 2A illustrates a cross-sectional view of an electronic package in accordance with another embodiment of the present invention.
Figure 2B:
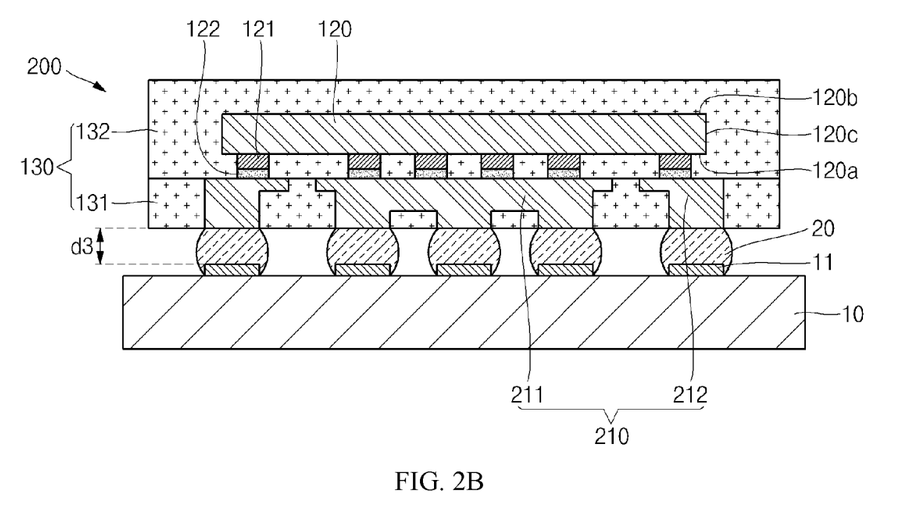
FIG. 2B illustrates a cross-sectional view of the electronic package of FIG. 2A attached to a next level of assembly in accordance with an embodiment of the present invention.

FIG. 2A illustrates a cross-sectional view of an electronic package 200 or electronic package structure 200, such as a semiconductor package 200 in accordance with another embodiment. FIG. 2B illustrates a cross-sectional view of electronic package 200 attached to a next level of assembly, such as circuit board 10. In some embodiments, semiconductor package 200 includes a substrate 210, such as a lead frame 210 and substrate encapsulant 131, electronic die 120, such as semiconductor die 120, and package body 132. In one embodiment, substrate encapsulant 131 and package body 132 are configured as an encapsulant structure 130. In one embodiment, substrate encapsulant 131 encapsulates, covers, or encloses, for example, side portions of lead frame 210. Substrate encapsulant 131 includes a substrate top surface 131a and an opposing substrate bottom surface 131b. Semiconductor package 200 is similar to semiconductor package 100 illustrated in FIGS. 1A and 1B. Thus, the following description will focus more on differences between semiconductor package 100 and semiconductor package 200.

In one embodiment, lead frame 210 includes a die pad 211 having a die pad top surface 211a and an opposing die pad bottom surface 211b, a plurality of leads 212 each having a lead top surface 212a and an opposing lead bottom surface 212b, and a plurality of conductive bumps 213 disposed on die pad bottom surface 211b and lead bottom surfaces 212b. In one embodiment, a portion of die pad bottom surface 211b is formed having a plurality of pad portions 211c separated by one or more recesses. Stated another way, die pad bottom surface 211b is intentionally formed with a plurality of recessed portions such that die pad bottom surface 211b is not a continuous or substantially planar surface in contrast to die pad bottom surface 111c illustrated, for example, in FIG. 1A. In accordance with the present embodiment, the recess between pad portions 211c is encapsulated by substrate encapsulant 131. In one embodiment, parts of die pad bottom surface 211b and lead bottom surfaces 212b are substantially co-planar the substrate encapsulant bottom surface 131b or the bottom surface of encapsulant 130 as illustrated, for example, in FIG. 2A.

In accordance with the present embodiment, pad portions 211c are exposed to the outside of semiconductor package 200 and a conductive bump 213 is disposed on or adjacent the exposed die pad bottom surface 211b of pad portions 211c. In one embodiment, a conductive bump 231 is disposed on each pad portion 211c of die pad 211. Stated another way, die pad 211 includes a plurality of conductive bumps 213 disposed along die pad bottom surface 211b. In some embodiments, conductive bumps 213 can be a solder or other similar materials. In accordance with the present embodiment, conductive bumps 213 are formed in a solder-on-pad (SOP) type configuration. In one embodiment, die pad 211 comprises a conductive material such as copper, a copper alloy, a plated material, combinations thereof, or other materials as known to those of skill in the art.

In one embodiment, die pad 211 comprises a substantially rectangular plate shape having four sides and four corners, which may be rounded. It is understood that other shapes may be used as well. In some embodiments, the outer periphery of die pad 211 can be reduced in thickness using, for example, etching or stamping techniques. In accordance with the present embodiment, semiconductor die 120 is electrically connected to die pad 211 and plurality of leads 212 using, for example, conductive bumps 122. In one embodiment, more than on conductive bump 122 is used to electrically connect semiconductor die 120 to die pad 211.

In one embodiment, plurality of leads 212 are spaced apart from the peripheral edge segments (e.g., four sides) of die pad 211 and can arranged in directions perpendicular to the peripheral edge segments. Each lead 212 is further spaced apart from other leads 212 so that the leads are electrically disconnected from each other in some embodiments. It is understood that in other embodiments, some of the leads 212 can be electrically connected to each other in accordance with the requirements of a particular system application. In accordance with the present embodiment, each lead bottom surface 212b is exposed to the outside of semiconductor package 200 and includes a conductive bump 213 disposed on the exposed lead bottom surface 212b surface as illustrated, for example, in FIG. 2A.

In accordance with the present embodiment, conductive bumps 213 are placed onto lead frame 210 prior to semiconductor package 200 being attached to circuit board 10 with solder balls 20 so that solder balls 20 are not directly attached to lead frame 210 as in previous package structures. In one embodiment, conductive bumps 213 and solder balls 20 preferably comprise the same material. In other embodiments, conductive bumps 213 and solder balls 20 may comprise different materials. In accordance with the present embodiment, by placing conductive bumps 213 onto lead frame 210 before attaching semiconductor package 200 to a next level of assembly, semiconductor package 200 can be more easily and firmly attached or connected to circuit board 10. This attribute provides for a more stable assembled structure, which further improves reliability. In an alternative embodiment, solder balls 20 can be advantageously attached to conductive bumps 213 prior to or in advance of the attachment of semiconductor package 200 to the next level of assembly. In some embodiments, solder balls 20 can have a thickness d3 of about 200 microns or less.

Figure 3A:
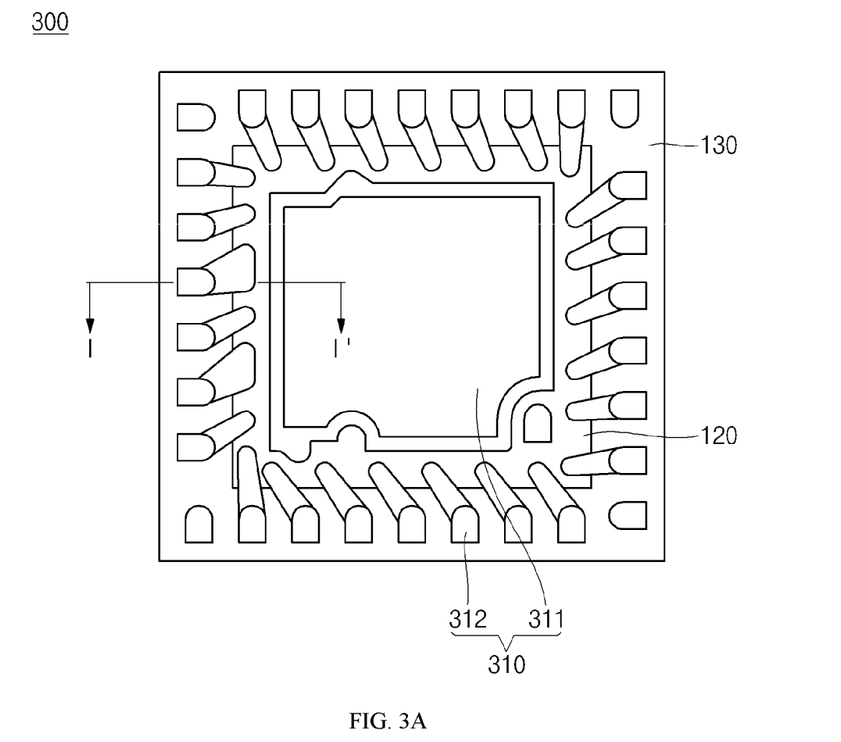
FIG. 3A illustrates a perspective plan view of an electronic package in accordance with a further embodiment of the present invention.
Figure 3B:
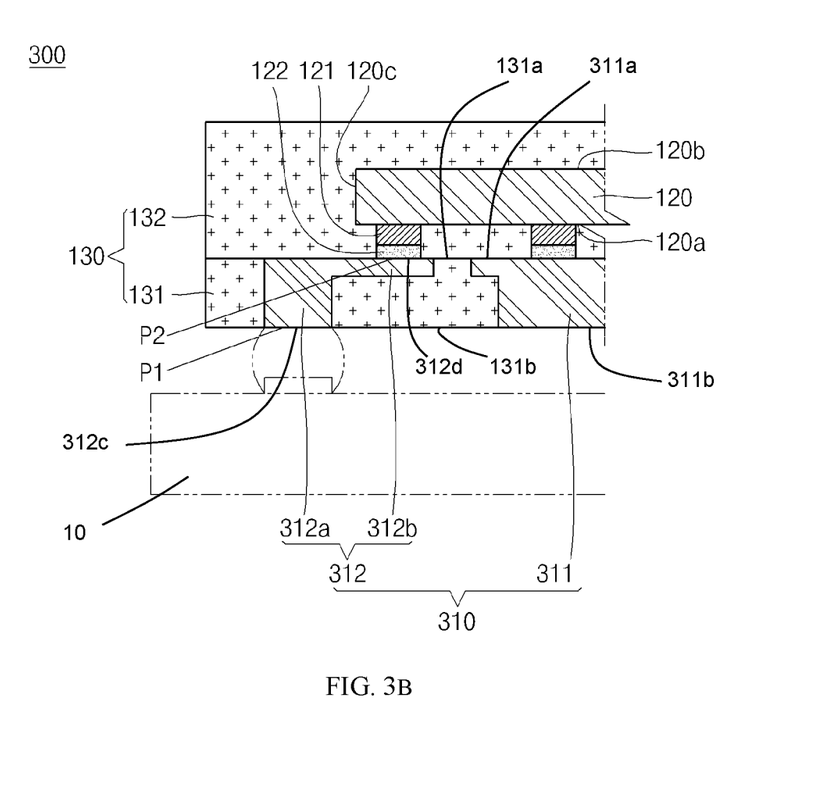
FIG. 3B illustrates a partial cross-sectional view of the electronic package of FIG. 3A taken along reference line 1-1' of FIG. 3A attached to a next level of assembly in accordance with an embodiment of the present invention.

FIG. 3A illustrates a perspective plan view of an electronic package 300 or electronic package structure 300, such as a semiconductor package 300 in accordance with a further embodiment. FIG. 3B illustrates a partial cross-sectional view of semiconductor package 300 taken along reference line 1-1' of FIG. 3A. As illustrated in FIG. 3B, semiconductor package 300 can be attached to, for example, a next level of assembly, such as circuit board 10. In accordance with the present embodiment, semiconductor package 300 comprises a substrate 310, such as lead frame 310 and substrate encapsulant 131, semiconductor die 120, and package body 132. In one embodiment, substrate encapsulant 131 and package body 132 are configured as an encapsulant structure 130. Semiconductor package 300 is similar to semiconductor package 100 and semiconductor package 200 and the following description will focus more on the differences between semiconductor package 300 and semiconductor package 100 and semiconductor package 200.

Lead frame 310 includes a die pad 311 having a die pad top surface 311a and an opposing die pad bottom surface 311b. In one embodiment, die pad 311 comprises a substantially rectangular plate shape having four sides and four corners, which may be rounded. It is understood that other shapes may be used as well. In some embodiments, the outer periphery of die pad 311 can be reduced in thickness using, for example, etching or stamping techniques. In one embodiment, die pad 311 comprises a conductive material such as copper, a copper alloy, a plated material, combinations thereof, or other materials as known to those of skill in the art.

Lead frame 310 further comprises a plurality of leads 312 spaced apart from die pad 311. In one embodiment, plurality of leads 312 are spaced apart from the peripheral edge segments (e.g., four sides) of die pad 311 and can be arranged in directions perpendicular to the peripheral edge segments. Each lead 312 is further spaced apart from other leads 312 so that the leads are electrically disconnected from each other in some embodiments. It is understood that in other embodiments, some of leads 312 can be electrically connected to each other depending on the requirements of a specific system application. In accordance with the present embodiment, each lead 312 includes a first lead portion 312a and a second lead portion 312b extending laterally away from first lead portion 312a. In accordance with the present embodiment, second lead portion 312b has a lower portion reduced in thickness. In one embodiment, the lower portions of second lead portions 312b are half etched. In accordance with the present embodiment, first lead portion 312a includes a lead bottom surface 312c exposed to the outside of semiconductor package 300 and second lead portion 312b includes a lead top surface 312d configured to attach to or electrically connect with semiconductor die 120. In one embodiment, first lead portion 312a is positioned at an outermost part of lead frame 310 and lead bottom surface 312c of first lead portion 312a is exposed to the outside of semiconductor package 300. In one embodiment, lead bottom surface 312c of first lead portion 312a is a portion or surface configured to connect to conductive structure 20 or solder ball 20 when semiconductor package 300 is assembled with or attached to circuit board 10.

Second lead portions 312b are formed to extend from first lead portions 312a towards die pad 311. Since the lower portion of each second lead portion 312b is reduced in thickness and filled, encapsulated, or covered by encapsulant 130, such as substrate encapsulant 131, second lead portion 312b is not exposed to the outside of semiconductor package 300. Stated another way, the lower portion of each second lead portion 312b is encapsulated by substrate encapsulant 131 or encapsulant structure 130. In accordance with the present embodiment, semiconductor die 120 is attached to lead top surface 312d of second lead portion 312b. In one embodiment, conductive pads 121 on semiconductor die 120 are electrically connected to second lead portions 312b and die pad top surface 311a with conductive bumps 122. In accordance with the present embodiment, semiconductor die 120 is positioned to overlap second lead portion 312b but does not overlap first lead portion 312a. Stated another way, peripheral surfaces 120c of semiconductor die 120 are positioned on second lead portions 312b, but peripheral surfaces 120c do not overlap first lead portions 312a.

In accordance with the present embodiment, a first connection point P1, at which each of the plurality of leads 312 and the circuit board 10 are connected to each other, is positioned on lead bottom surface 312c of first lead portion 312a, and a second connection point P2, at which each of the plurality of leads 312 and the semiconductor die 120 are connected to each other, is positioned on lead top surface 312d of each second lead portion 312b. Stated another way, the first connection point P1 and the second connection point P2 are positioned to be laterally separated from each other. As described previously, the first connection point P1, at which each of plurality of leads 312 and circuit board 10 are connected to each other, and the second connection point P2, at which each of the plurality of leads 312 and the semiconductor die 120 are connected to each other, are positioned so as to not overlap each other, thereby attaining improved results in assembled structure reliability tests.

For example, in a case of a conventional semiconductor package in which the first connection point P1 and the second connection point P2 overlap each other, the conventional semiconductor package demonstrated 598 cycles of temperature circulation endurance during board level reliability tests. However, in a case of semiconductor package 300 according to the present embodiment where the first connection point P1 and the second connection point P2 do not overlap each other, semiconductor package 300 demonstrated 1104 cycles of temperature circulation endurance, which is about twice the temperature circulation endurance of the conventional package.

A temperature circulation endurance of a semiconductor package structure is tested by placing a semiconductor package in an enclosed chamber and investigating whether the semiconductor package is distorted or not while raising the temperature of the chamber to the highest temperature or lowering the temperature of the chamber to the lowest temperature at regular intervals. In addition, a cycle typically corresponds to a measurement period in which the internal temperature of the chamber is raised from a reference temperature (e.g., room temperature) to the highest temperature and is lowered to the lowest temperature to then be raised to the reference temperature.

In one embodiment, second lead portions 312b are angled with respect to first lead portions 312b as illustrated in FIG. 3A in order to accommodate I/O pad layout configurations on semiconductor die 120. In addition, in one embodiment one or more second lead portions 312b are of a different size or lateral width compared to other second lead portions 312b as illustrated in FIG. 3A in order to accommodate more than one I/O pad on semiconductor die 120.

In summary, in semiconductor package 300 first connection point P1, where each of the plurality of leads 312 and the circuit board 10 are connected to each other, and the second connection point P1, where each of the plurality of leads 312 and the semiconductor die 120 are connected to each other, are positioned so as not to overlap each other, thereby improving the board level reliability of semiconductor package 300.

It is understood that the features of semiconductor package 300 can be applied to semiconductor packages 100 and 200 described previously. Also, the features of semiconductor package 100 can be applied to either semiconductor package 200 or 300 or the features can be combined together in one semiconductor package.

In view of all of the above, it is evident that a novel structure and method is disclosed. Included, among other features, are protrusion structures, conductive bump structures, and/or connection point structures configured to improve the board level or assembled structure reliability. More particularly, the features described herein singularly or in various combinations reduce board level failures resulting from temperature circulation endurance tests, as well as others.

While the present invention has been particularly illustrated and described with reference to exemplary embodiments thereof, it will be understood by those of ordinary skill in the art that various changes in form and details can be made therein without departing from the spirit and scope of the present invention as defined by the following claims. By way of example, the semiconductor packages can be configured as multi-chip packages. It is therefore desired that the present embodiments be considered in all respects as illustrative and not restrictive, reference being made to the appended claims rather than the foregoing description to indicate the scope of the invention.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments as would be understood by those skilled in the art.

What is claimed is:

1. A method for providing an electronic package structure, comprising:
   providing an electronic component comprising:
      a substrate comprising:
         a die pad having a die pad top surface, an opposing die pad bottom surface, and die pad side surfaces, wherein the die pad comprises a conductive material;
         leads laterally spaced apart from the die pad and having lead top surfaces, opposing lead bottom surfaces, and lead side surfaces; and
         a substrate encapsulant interposed between the die pad and the leads, wherein the substrate encapsulant has a substrate encapsulant top surface and an opposing substrate encapsulant bottom surface, wherein the die pad bottom surface and the lead bottom surfaces lie on a first plane and the substrate encapsulant bottom surface lies on a second plane that is different than the first plane, wherein the substrate encapsulant top surface terminates proximate to the lead top surfaces and the die pad top surface so that the lead top surfaces and the die pad top surface are exposed outside of the substrate encapsulant top surface, and wherein the lead side surfaces and the die pad side surfaces are covered by the substrate encapsulant;
      an electronic device having a first major surface and a second major surface opposite to the first major surface and a pair of opposing outer edges in a cross-sectional view, wherein:
         the electronic device is connected to the substrate such that the first major surface of the electronic device is attached with conductive bumps to the die pad top surface and the lead top surfaces, and the outer edges overlap an opposing pair of the leads in the cross-sectional view; and
      providing a package body encapsulating the electronic device and the substrate encapsulant top surface such that the substrate encapsulant bottom surface is exposed outside the package body;
      providing a circuit board having a circuit pattern formed thereon; and
      connecting the substrate to the circuit pattern using first conductive structures, wherein:
         the substrate comprises a first lead having a first lead portion exposed to the outside of the substrate bottom surface and second lead portion laterally extending towards the die pad and having a recessed bottom surface encapsulated by the substrate encapsulant;
         the electronic device comprises a second conductive structure adjacent to the first major surface;
         the second conductive structure is connected to the second lead portion at a first connection point with one of the conductive bumps;
         connecting the substrate to the circuit pattern comprises connecting the first lead to the circuit pattern at a second connection point;
         the first connection point is laterally separated from the second connection point; and
         the electronic device overlaps the first connection point but not the second connection point.

2. The method of claim 1, wherein:
providing the electronic component comprises:
   providing the die pad comprising pad portions defined in the die pad bottom surface, wherein the pad portions are separated by recesses; and
   providing the substrate encapsulant disposed within the recesses.

3. The method of claim 1, wherein:
the substrate encapsulant and the package body comprise separate layers; and
the die pad comprises a width that is less than that of the electronic device.

4. The method of claim 1, wherein:
providing the electronic component comprises providing the die pad bottom surface comprising a continuous and substantially planar surface; and
connecting the substrate to the circuit pattern comprises:
   connecting the die pad bottom surface to a first portion of the circuit pattern with a first conductive structure; and
   connecting a lead to a second portion of the circuit pattern with a second conductive structure, wherein the first conductive structure has a greater width than the second conductive structure.

5. The method of claim 4, wherein:
connecting the die pad bottom surface comprises providing the first conductive structure extending entirely across the die pad bottom surface.

6. The method of claim 1, wherein:
connecting the substrate to the circuit pattern comprises:
> providing a first one of the first conductive structures surrounding vertical side surfaces of the die pad protruding from the substrate bottom surface; and
> providing a second one of the first conductive structures surrounding vertical side surfaces of one of the leads protruding from the substrate bottom surface.

7. The method of claim 1, wherein:
providing the electronic component comprises providing the die pad having a lateral width configured to accommodate more than one conductive bump.

8. An electronic package structure comprising:
a substrate comprising:
> a die pad having a die pad top surface and an opposing die pad bottom surface, wherein the die pad comprises a conductive material;
> leads laterally spaced apart from the die pad each lead having a lead top surface and an opposing lead bottom surface; and
> a substrate encapsulant interposed between the die pad and the leads, wherein the substrate encapsulant has a substrate top surface and an opposing substrate bottom surface; and an electronic die electrically coupled to the die pad and the leads, wherein:
> at least one lead comprises:
>> a first lead portion exposed to the outside of the substrate bottom surface and defining a first connection point for attaching the electronic package structure to a next level of assembly; and
>> a second lead portion laterally extending towards the die pad and having a recessed bottom surface encapsulated by the substrate encapsulant, the second lead portion defining a second connection point for attaching to the electronic die, wherein the first connection point is laterally separated from the second connection point, wherein a conductive structure on the electronic die is attached to the second lead portion at the second connection point, and wherein the electronic die overlaps the second connection point but not the first connection point.

9. The structure of claim 8, wherein:
the die pad bottom surface comprises a plurality of pad portions being separated by recesses; and
the substrate encapsulant is disposed within the recesses.

10. The structure of claim 9, further comprising:
conductive bumps disposed on each pad portion of the plurality of pad portions and the lead bottom surfaces.

11. The structure of claim 8, wherein:
the leads comprises lead top surfaces and opposing lead bottom surfaces;
the die pad bottom surface and the lead bottom surfaces lie on a first plane and the substrate bottom surface lies a on a second plane that is different that the first plane;
the die pad comprises a lateral width that is different than that of the one lead; and
the structure further comprises conductive bumps disposed on the lead bottom surfaces.

12. The structure of claim 8, further comprising:
a package body encapsulating the electronic die and the substrate top surface, wherein:
> the substrate bottom surface is exposed outside of the package body.

13. The structure of claim 8, further comprising:
a package body encapsulating the electronic die and the substrate top surface, wherein:
> the substrate bottom surface is exposed outside the package body;
> the electronic die comprises a plurality of conductive structures on a major surface;
> the plurality of conductive structures are electrically coupled to the leads and the die pad with conductive bumps; and
> more than one conductive bump connects the electronic die to the die pad.

14. A method for providing an electronic package structure, comprising:
providing a substrate including:
> a die pad and leads spaced apart from the die pad, wherein the leads each comprise first portions and second portions integral with the first portions; and
> a substrate encapsulant interposed between the die pad and the leads, the substrate encapsulant comprising a substrate encapsulant top surface and an opposing substrate encapsulant bottom surface, wherein top surfaces of the leads and a top surface of the die pad are exposed from the substrate encapsulant top surface, and bottom surfaces of the first portions of the leads are exposed from the substrate encapsulant bottom surface;

providing an electronic device;
connecting the electronic device to the second portions of the leads with conductive bumps to where the top surfaces of the leads are exposed from the substrate encapsulant top surface, wherein:
> the second portions of the leads extend towards the die pad and have recessed bottom surfaces encapsulated by the substrate encapsulant;
> the first portions of the leads are configured to define first connection points for attaching the electronic package structure to a next level of assembly;
> the electronic device is connected to the second portions of the leads with the conductive bumps at second connection points;
> the first connection points and the second connection points are laterally separated from each other; and
> the electronic device overlaps the second connection points but not the first connections point; and providing a package body encapsulating the electronic device and substrate encapsulant top surface such that the substrate encapsulant bottom surface is exposed outside of the package body.

15. The method of claim 14, wherein:
providing the substrate comprises providing the second portions of the leads angled at less than 90 degrees with respect to the first portions of the leads in a top plan view, where at least one second portion has a larger width than another second portion.

16. The method of claim 14, wherein:
providing the substrate encapsulant comprises exposing the die pad and the leads in the substrate bottom surface.

17. The method of claim 14, wherein providing the substrate comprises:
providing the substrate encapsulant such that the die pad and the leads protrude outward from the substrate bottom surface to provide the die pad and the leads with exposed side surfaces configured to engage solder structures.

18. The method of claim 14, wherein:
the substrate encapsulant and the package body comprise separate material layers; and
the die pad comprises a lateral width that can accommodate more than one conductive bump.

\* \* \* \* \*